US009853241B2

(12) United States Patent
Bi et al.

(10) Patent No.: US 9,853,241 B2
(45) Date of Patent: Dec. 26, 2017

(54) ORGANIC LIGHT-EMITTING DISPLAY APPARATUS AND FABRICATION METHOD THEREOF

(71) Applicants: Shanghai Tianma AM-OLED Co., Ltd., Shanghai (CN); Tianma Micro-electronics Co., Ltd., Shenzhen (CN)

(72) Inventors: Defeng Bi, Shanghai (CN); Kaen Jiang, Shanghai (CN)

(73) Assignees: SHANGHAI TIANMA AM-OLED CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 0 days.

(21) Appl. No.: 15/155,238

(22) Filed: May 16, 2016

(65) Prior Publication Data
US 2017/0155075 A1 Jun. 1, 2017

(30) Foreign Application Priority Data

Nov. 30, 2015 (CN) .......................... 2015 1 0853964

(51) Int. Cl.
H01L 29/08 (2006.01)
H01L 51/52 (2006.01)
(Continued)

(52) U.S. Cl.
CPC ........ *H01L 51/525* (2013.01); *H01L 27/3211* (2013.01); *H01L 27/3246* (2013.01);
(Continued)

(58) Field of Classification Search
CPC ........ G01D 5/204; H02K 11/225; H02P 6/16; H01L 2227/323; H01L 27/3206; H01L 27/3246; H01L 51/525; H01L 51/56
(Continued)

(56) References Cited

U.S. PATENT DOCUMENTS 6,768,257 B1 * 7/2004 Yamada .............. H01L 27/1214
257/350
2008/0238968 A1 * 10/2008 Kuwata .................. B41J 2/2132
347/12
(Continued)

FOREIGN PATENT DOCUMENTS

CN 104701341 A 6/2015

*Primary Examiner* — Mohammed Shamsuzzaman
(74) *Attorney, Agent, or Firm* — Anova Law Group, PLLC

(57) ABSTRACT

The present disclosure provides an organic light-emitting display apparatus and a fabrication method thereof. The organic light-emitting display apparatus comprises a substrate having a device component layer; first electrodes disposed over the device component layer; a pixel-defining layer having opening regions to expose the first electrodes formed over the device component layer; photo spacers, disposed on the pixel-defining layer, and surrounding at least one opening region to provide a first photo spacer group along the at least one opening region in a first direction and provide a second photo spacer group along the at least one opening region in a second direction; an organic light-emitting layer disposed in the opening regions of the pixel-defining layer and in contact with the first electrodes; and a second electrode disposed on the light-emitting layer. The first photo spacer group has a continuous projection on the first direction, and the second photo spacer group has a continuous projection on the second direction.

12 Claims, 11 Drawing Sheets

(51) Int. Cl.
*H01L 27/32* (2006.01)
*H01L 51/56* (2006.01)
*H01L 51/00* (2006.01)

(52) U.S. Cl.
CPC .......... *H01L 51/0011* (2013.01); *H01L 51/56* (2013.01); *H01L 2227/323* (2013.01)

(58) Field of Classification Search
USPC .......... 257/40, 687; 313/509, 504; 349/153, 349/110
See application file for complete search history.

(56) References Cited

U.S. PATENT DOCUMENTS

| | | | | |
|---|---|---|---|---|
| 2009/0066903 | A1* | 3/2009 | Yoshida | G02F 1/1339 349/153 |
| 2009/0103025 | A1* | 4/2009 | Tanno | G02F 1/134363 349/110 |
| 2010/0033084 | A1* | 2/2010 | Ko | H01L 51/5012 313/504 |
| 2010/0176720 | A1* | 7/2010 | Yamazaki | H01L 27/3246 313/509 |
| 2012/0313844 | A1* | 12/2012 | Im | H01L 27/3216 345/76 |
| 2013/0049184 | A1* | 2/2013 | Kasahara | H01L 51/525 257/687 |
| 2015/0102320 | A1* | 4/2015 | Jung | H01L 27/3218 257/40 |
| 2015/0162391 | A1* | 6/2015 | Kim | H01L 27/3218 257/40 |
| 2016/0268363 | A1* | 9/2016 | Hatano | H01L 51/525 |

* cited by examiner

ORGANIC LIGHT-EMITTING DISPLAY APPARATUS AND FABRICATION METHOD THEREOF

CROSS-REFERENCES TO RELATED APPLICATIONS

This application claims the priority of Chinese patent application No. 201510853964.5, filed on Nov. 30, 2015, the entirety of which is incorporated herein by reference.

BACKGROUND

Organic light-emitting (OLED) display apparatus is a self-light-emitting type of display apparatus. Because the OLED display apparatus does not require an external light source, the OLED display apparatus may be lightweight, and ultrathin. Further, comparing with LCD display apparatus, the OLED display apparatus has a wide viewing-angle, high contrast, and fast response. With the development of the display technology, the OLED display apparatus has become more and more widely used.

Currently, the OLED display apparatus includes two types. One type of the OLED display apparatus includes a plurality of sub-pixels; and one sub-pixel emits only one color of a plurality of colors. Because the light emitted from each sub-pixel of the OLED display apparatus is a monochromatic light, the OLED display apparatus does not need a color film. The other type of OLED display apparatus also includes a plurality of sub-pixels, and each sub-pixel emits a white light. Thus, it requires a color film to filter the white light to obtain monochromatic light.

FIG. 1 illustrates an existing structure of photo spacers; and FIG. 2 illustrates another existing structure of photo spacers. In FIG. 1, the photo spacers 115 are disposed between corners of adjacent sub-pixels. That is, a circular photo spacer 115 is disposed close to a corner of the opening 117. In FIG. 2, the photo spacers 116 are disposed between sides of adjacent sub-pixels 118. That is, a circular photo spacer 116 is disposed close to the middle of a side of the sub-pixel 118. The photo spacers (115 or 116) contact with a mask during an evaporation process; and support the mask.

The light-emitting layer in an OLED display apparatus is usually formed by an evaporation process. During the evaporation process, overlapping regions of light-emitting materials may be formed. When each sub-pixel emits a different color in the OLED display apparatus, the overlapped light-emitting materials would generate color-mixing issues. Thus, the display quality of the OLED display apparatus is adversely affected.

The disclosed apparatus and methods are directed to solve one or more problems set forth above and other problems.

BRIEF SUMMARY OF THE DISCLOSURE

One aspect of the present disclosure includes an organic light-emitting display apparatus. The organic light-emitting display apparatus comprises a substrate; a device component layer disposed over the substrate; a plurality of first electrodes disposed over the device component layer; a pixel-defining layer having a plurality of opening regions to expose the first electrodes formed over the device component layer; a plurality of photo spacers, disposed on the pixel-defining layer, and surrounding at least one opening region to provide a first photo spacer group along the at least one opening region in a first direction and provide a second photo spacer group along the at least one opening region in a second direction; an organic light-emitting layer disposed in the at least one opening regions of the pixel-defining layer and in contact with the first electrodes; and a second electrode disposed on the light-emitting layer. The first photo spacer group has a continuous projection on the first direction, and the second photo spacer group has a continuous projection on the second direction.

Another aspect of the present disclosure includes a method for fabricating an organic light-emitting apparatus. The method comprises providing a substrate; forming a device component layer over the substrate; forming a plurality of first electrodes over the device component layer; forming a pixel-defining layer over the device component layer and forming a plurality of opening regions to expose the plurality of first electrodes; forming a plurality of photo spacers having a pre-determined distribution patterns around at least one of the plurality of opening regions over the pixel-defining layer, the plurality of photo spacers form a first photo spacer group along the first direction and a second photo spacer group along a second direction, the first photo spacer group has a continuous projection on the first direction and the second photo spacer group has a second continuous projection on the second direction; forming an organic light-emitting layer on the first electrodes in the opening regions; and forming a second electrode over the organic light-emitting layer.

Another aspect of the present disclosure includes another method for fabricating an organic light-emitting apparatus. The method comprises providing a substrate; forming a device component layer over the substrate; forming a plurality of first electrodes over the device component layer; forming a pixel-defining layer and a plurality of photo spacers simultaneously over the device component layer, the pixel-defining layer has a plurality of opening regions, the plurality of photo spacers surround at least one opening region to provide a first photo spacer group along the at least one opening in the first direction and provide a second photo spacer group along the at least opening region in a second direction, the first photo spacer group has a continuous projection on the first direction and the second photo spacer group has a second continuous projection on the second direction; forming an organic light-emitting layer on the first electrodes in the opening regions; and forming a second electrode over the organic light-emitting layer.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
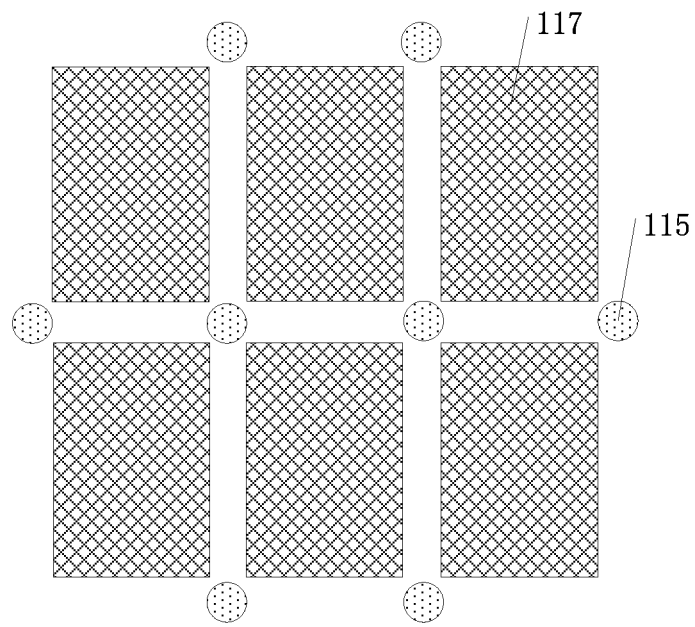
FIG. 1 illustrates a top view of an existing OLED display apparatus.
Figure 2:
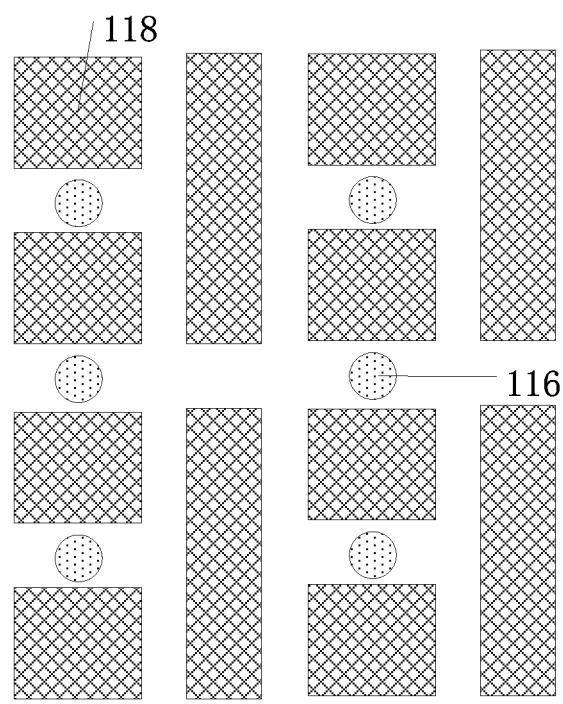
FIG. 2 illustrates a top view of another existing OLED display apparatus.
Figure 3:
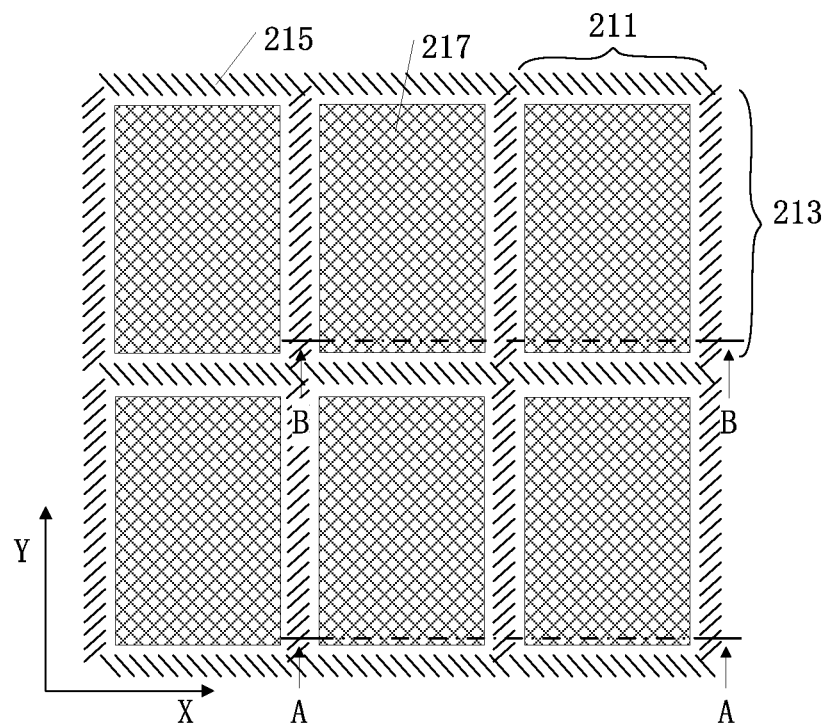
FIG. 3 illustrates a top view of an exemplary OLED display apparatus consistent with the disclosed embodiments.
Figure 5:
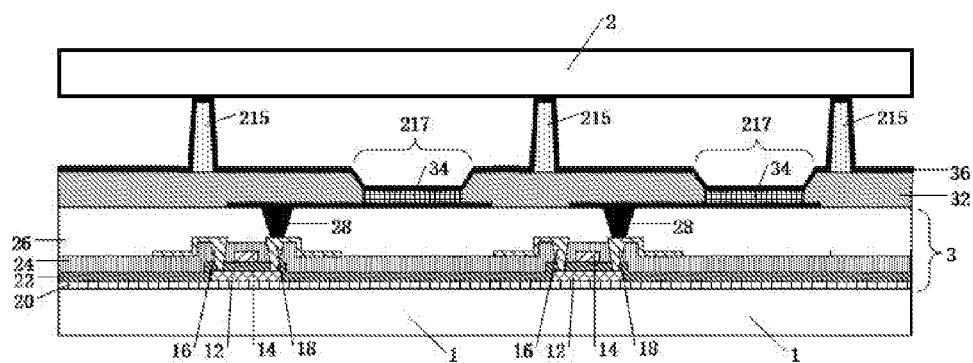
FIG. 5 illustrates a cross-sectional view of the structure illustrated in FIG. 3 along the A-A direction.

FIG. 3 illustrates a top view of an exemplary OLED display apparatus consistent with the disclosed embodiments. FIG. 5 illustrates a cross-sectional view of the structure illustrated in FIG. 3 along the A-A direction; and FIG. 6 illustrates a cross-sectional view of the structure illustrated in FIG. 3 along the B-B direction.

For illustrative purposes, the structure having one thin-film transistor is illustrated. In certain other embodiments, one pixel of the OLED display apparatus may correspond to a plurality of transistors.

Figure 6:
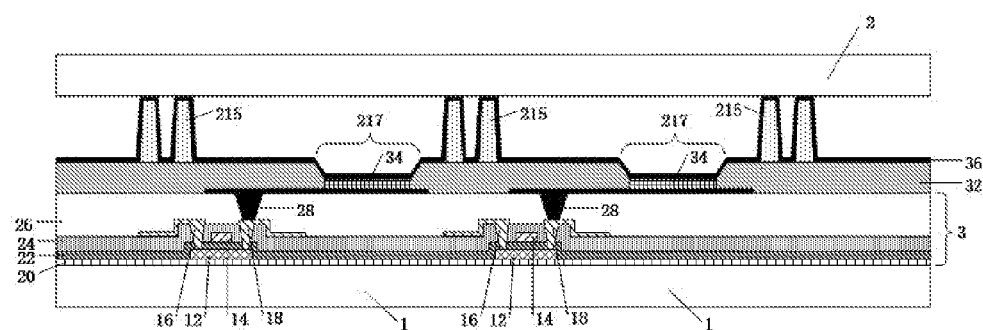
FIG. 6 illustrates a cross-sectional view of the structure illustrated in FIG. 3 along the B-B direction.

As shown in FIG. 3, FIG. 5 and FIG. 6, the OLED display apparatus may include a substrate 1, and a device component layer 3 formed on the substrate 1. In one embodiment, the device component layer 3 may include one or more thin film transistors (TFTs). The device component layer 3 may include a buffer layer 20, a semiconductor layer 12, a gate 14, a source 18, a drain 16, a first insulation layer 22, a second insulation layer 24, and a third insulation layer 26. The OLED display apparatus may also include a first electrode 28 formed over the device component layer 3; and a pixel-defining layer 32 formed over the first electrode 28 and the third insulation layer 26. The pixel-defining layer 32 may have an opening region 217 (corresponding to a pixel region) exposing the first electrode 28. Further, the OLED display apparatus may also include a plurality of photo spacers 215 disposed over the pixel-defining layer 32; and an organic light-emitting layer 34 disposed in the opening region 217 and electrically connected with the first electrode 28. Further, the OLED display apparatus may also include a second electrode 36 disposed on the organic light-emitting layer 34; and a glass cover plate 2 for packaging the OLED display apparatus.

In certain other embodiments, the substrate 1 may be a flexible substrate formed by coating organic material on a glass substrate. The OLED display apparatus may be packaged by a plurality of organic layers and/or a plurality of inorganic layers without the glass cover plate.

The photo spacers 215 may surround at least one opening region 217; and may be formed into first spacer groups along first direction; and may be formed into a second photo spacer groups along a second direction. The projections of the first photo spacer groups on the first direction may be continuous; and the projections of the second photo spacer groups on the second direction may be continuous.

Specifically, when the organic layer light-emitting layer 34 on in two adjacent opening regions 217 emit different colors of light, the photo spacers 215 may surround each of the two adjacent opening regions 217.

Figure 4:
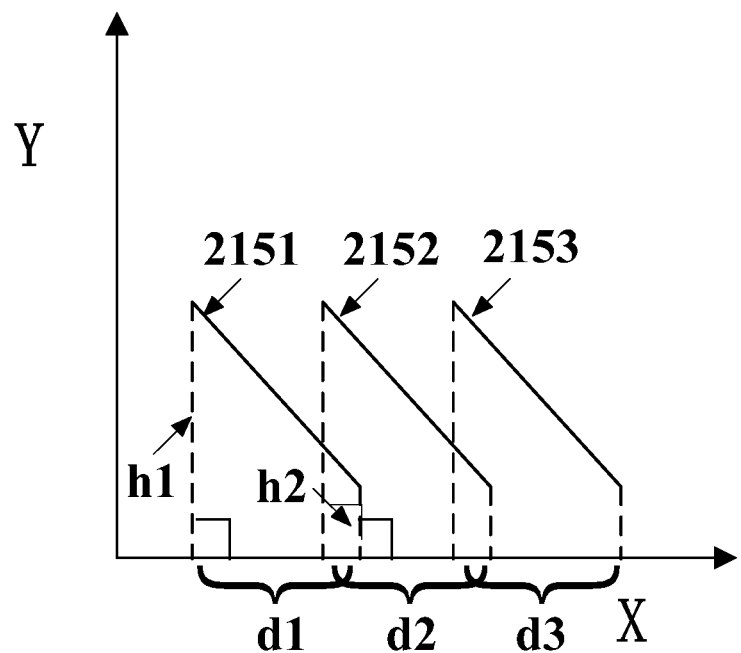
FIG. 4 illustrates a projection of the photo spacers illustrated in FIG. 3.

FIG. 4 illustrates a projection of the photo spacers 215. As shown in FIGS. 3-4, each of the photo spacers 215 may be line-shaped. The plurality of photo spacers 215 may surround the opening region 217. The photo spacers 215 may be configured in a single-row and form first photo spacer groups 211, along the first direction "X". Further, adjacent photo spacers 215 along the first direction "X" may not be connected with each other; and the projection of the photo spacers 215 along the first direction "X" may be continuous. For example, the photo spacers 215 may be continuously configured along the entire row projected on "X" direction as shown in FIGS. 3-4.

Likewise, the plurality of photo spacers 215 may be configured in a single-column and form second photo spacer groups 213, along the second direction "Y". Adjacent photo spacers 215 along the second direction "Y" may not be connected with each other; and the projection of the photo spacers 215 along the second direction "Y" may be continuous along the entire column in "Y" direction as shown in FIGS. 3-4.

As shown in FIG. 4, three photo spacers 2151, 2152, and 2153 are illustrated. The projection of the photo spacer 2151 may be obtained by a following method. First, a line h1 perpendicular to the first direction X may be drawn from one end of the photo spacer 2151; and another line h2 perpendicular to the first direction X may be drawn from the other end of the photo spacer 2151. The line h1 and the line h2 may cross with the first direction X; and the distance between the two crossing points may be referred to as the projection d1 of the photo spacer 2151 on the first direction X. By a similar method, the projection of the photo spacer 2152 on the first direction X may be obtained as d2; and the projection of the photo spacer 2153 on the first direction X may be obtained as d3. d1, d2 and d3 may connect, or have certain overlaps. That is, d1, d2, and d2 may not be interrupted. In one embodiment, the projection of the first photo spacer groups 211 on the first direction X and the projection of the second photo spacer groups 213 on the second direction Y may connect with each other.

In one embodiment, the projection of the first photo spacer group 211 on the first direction X may be longer than the length of the corresponding opening region 217 along the first direction X. The projection of the second photo spacer group 213 on the second direction Y may be longer than the length of the corresponding opening region 217 along the second direction Y. The projection of the first photo spacer group 211 on the first direction X and the projection of the second photo spacer group 213 may not connect.

Further, as shown in FIG. 5, there may be one photo spacer 215 at each side of one opening region 217, respectively. As shown in FIG. 6, there may be two photo spacers 215 at each side of the opening region 217. Thus, it may further indicate that the projection of the second photo spacer group 213 on the second direction Y may have certain overlaps; and the adjacent photo spacers 215 may not connect.

Such cross-sectional views are for illustrative purposes only. Other cross-sectional views may also be obtained depending on the positions of the cross-sections. For example, one side of the opening region 217 may have one photo spacer; and the other side of the photo spacer may have two photo spacers.

The projections of the photo spacers 215 on the first direction X may be continuous; the projections of the photo spacers 215 on the second direction Y may be continuous; and the projections of the photo spacers 215 on the first direction X and the projections of the photo spacers 215 on the second direction Y may cross with other. Thus, when the light-emitting layer 34 is formed by an evaporation process, the photo spacers 215 may be able to prevent the light-emitting layer 34 needed to be formed in the opening region 217 surrounded by the photo spacers 215 from mixing with the light-emitting layers needed to be formed in all the adjacent opening regions 217. Accordingly, the color mixing issue of the OLED display apparatus may be prevented.

In one embodiment, the photo spacers 215 surrounding the opening regions 217 are not connected; and there are certain distances between adjacent photo spacers 215. Such a configuration may ensure the second electrode 36 to be electrically continuous. If the adjacent photo spacers 215 are connected, even they may be able to prevent the color mixing issue, the second electrode 36 may be broken by the photo spacers 215; and may not be electrically continuous. Accordingly, the second electrode 36 may be unable to drive the OLED display apparatus to function properly.

Further, although the above described photo spacers 215 may surround each opening region 217, the photo spacers 215 may also have other appropriate distributions and configurations encompassed herein without any limitations. In the existing pixel distribution, the light-emitting layers corresponding to adjacent opening regions may emit different colors of light, or a same color of light. The purposes for distributing the photo spacers 215 with disclosed patterns may be to prevent the color mixing issue of adjacent pixels corresponding to adjacent openings. Thus, if the light-emitting layers 34 corresponding to adjacent opening regions 217 emit a same color of light, it may be unnecessary to isolate the adjacent opening regions 217 with each other using the photo spacers 215.

Figure 7:
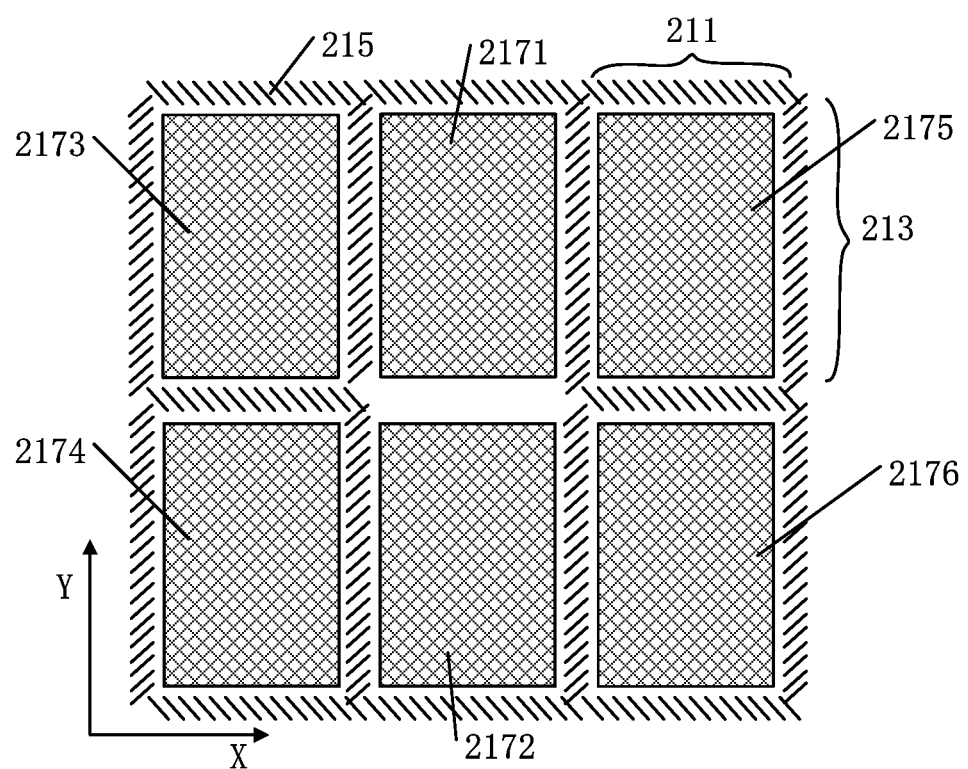
FIG. 7 illustrates a top view of another exemplary OLED display apparatus consistent with the disclosed embodiments.

Specifically, as shown in FIG. 7, which is a top view of another exemplary organic light-emitting apparatus consistent with the disclosed embodiments, when the organic light-emitting layers 34 in two adjacent openings 217 emit a same color of light, the photo spacers 215 may surround the two adjacent opening regions 217. As shown in FIG. 7, the organic light-emitting layers 34 in the opening region 2171 and the opening region 2172 may emit a same color of light. The color of the light emitted from the organic light-emitting layers 34 in the opening region 2173, the opening region 2174, the opening region 2175 and the opening region 2176 may all be different from the color of the light emitted from the light-emitting layers 34 in the opening region 2171 and the opening region 2172. The color of light emitted from the organic light-emitting layer 34 in the opening region 2171 may be different from the color of the light emitted from the organic light-emitting layer 34 in the opening region 2174. The color of light emitted from the organic light-emitting layer 34 in the opening region 2175 may be different from the color of the light emitted from the organic light-emitting layer 34 in the opening region 2176. Thus, there may be no photo spacers between the opening region 2171 and the opening region 2172. Photo spacers 215 may be disposed between the opening region 2173 and the opening region 2174, between the opening region 2175 and the opening region 2176, between the open region 2171 and the region having the opening region 2173 and the opening region 2174 and between the opening region 2172 and the region having the opening region 2174 and the opening region 2176.

Correspondingly, when the light-emitting layers 34 in a plurality of adjacent opening regions 217 are on the first direction X or the second direction Y emitting a same color of light, the photo spacers 315 may surround the region having the plurality of adjacent openings regions 217. That is, referring to FIG. 7, the number of the adjacent opening regions 217 emitting the same color of light may be greater than two.

Figure 8:
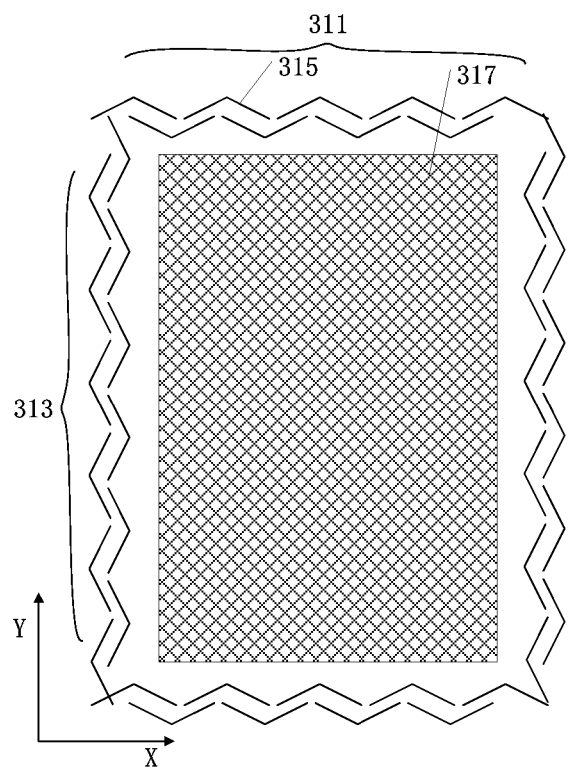
FIG. 8 illustrates the top view of the repeating units of another exemplary OLED display apparatus consistent with the disclosed embodiments.

FIG. 8 illustrates a top view of the repeating units of another exemplary OLED display apparatus consistent with the disclosed embodiments. Comparing with FIGS. 3-6, the shape of the photo spacers may be changed; but other structures may be similar.

As shown in FIG. 8, the photo spacers 315 may be polyline-shaped. Two adjacent photo spacers 315 may engage to each other. Further, the plurality of photo spacers 315 may surround the pixel region 317. The photo spacers 315 may be aligned into a first photo spacer group 311 along a first direction X; and the projection of the photo spacers 315 on the first direction X may be continuous. The photo spacers 315 may be aligned into a second photo spacer group 313 along a second direction Y; and the projection of the second photo spacer group 313 on the second direction Y may be continuous. The projection of the first photo spacer group 311 on the first direction X and the projection of the second photo spacer group 313 on the second direction Y may connect.

Further, the two engaging photo spacers 315 in the first photo spacer group 311 may be mutually mirror-symmetric; and may have certain distances to cause them not to connect along the second direction Y. The two engaging photo spacers 315 in the second photo spacer group 313 may be mutually mirror-symmetric; and may have certain distances to cause them not to connect along the first direction X.

Figure 9:
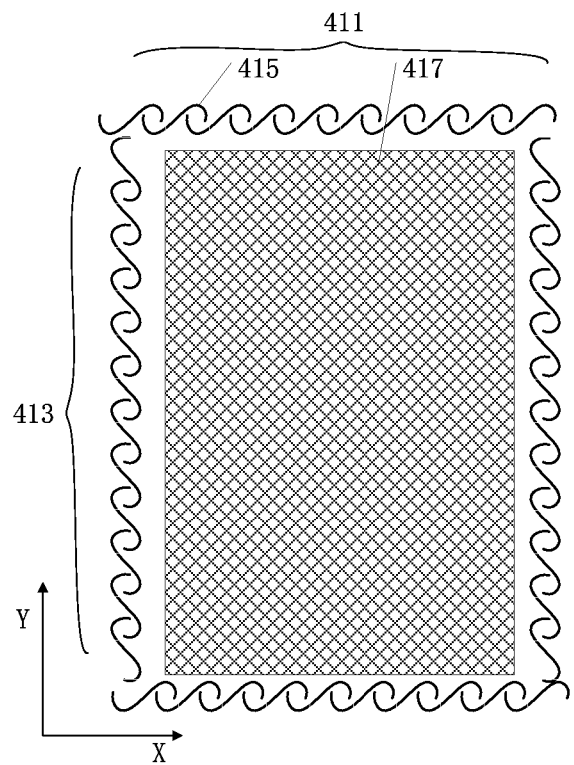
FIG. 9 illustrates the top view of the repeating units of another exemplary OLED display apparatus consistent with the disclosed embodiments.

In certain other embodiments, the photo spacers may be other appropriate shape of which adjacent photo spacers may be able to mutually engage. FIG. 9 illustrates a top view of the repeating units of another exemplary OLED display apparatus consistent with the disclosed embodiments. Comparing with FIG. 3-8, the shape of the photo spacers may be changed; but other structures may be similar.

As shown in FIG. 9, the photo spacers the photo spacers 415 may be S-shaped. Two adjacent photo spacers 415 may engage to each other. Further, the plurality of photo spacers 415 may surround the opening region or pixel region 417. The photo spacers 415 may be aligned into a first photo spacer group 411 along a first direction X; and the projection of the first photo spacer group 411 on the first direction X may be continuous. The photo spacers 415 may be aligned into a second photo spacer group 413 along a second direction Y; and the projection of the second photo spacer group 413 on the second direction Y may be continuous. The projection of the first photo spacer group 411 on the first direction X and the projection of the second photo spacer group 413 on the second direction Y may connect. Adjacent photo spacers 415 may have certain distances; and may not connect to each other.

In certain other embodiments, the projection of the photo spacers with the polyline shape or the S shape on the first direction X may not connect with the projection of the photo spacers with the polyline shape or the S shape on the second direction Y. However, the projection on the first direction X may be greater than the length of the opening along the first direction. During the evaporation of the light-emitting material, because the projection of the photo spacers on the first direction X may be continuous; and the projection of the photo spacers on the second direction Y may be continuous, the photo spacers with the polyline shape or the S shape may still be able to prevent the mixing of the organic light-emitting material. At the same time, the certain distances between the adjacent photo spacers may be ensure the second electrode to have a continuously electrical connection.

Figure 10:
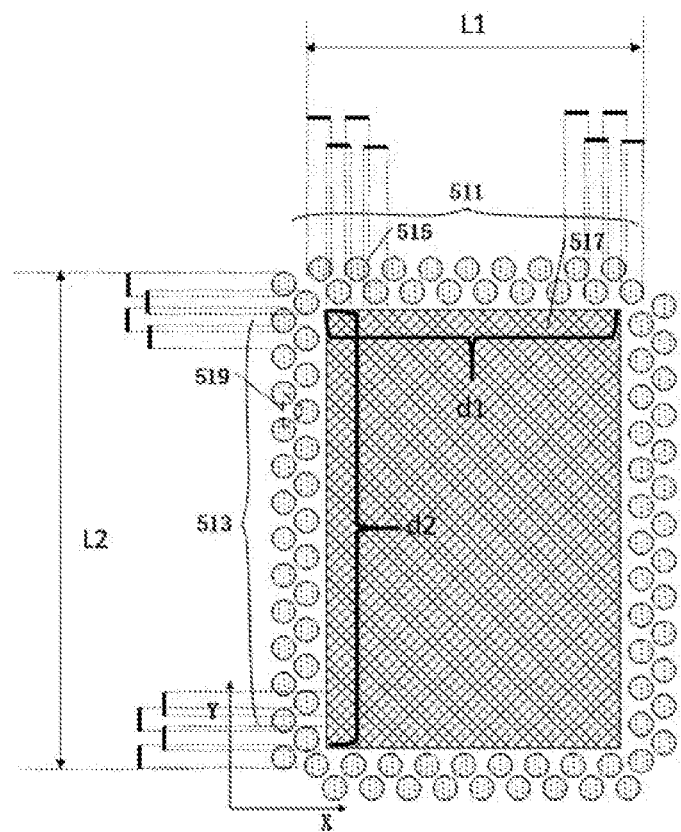
FIG. 10 illustrates the top view of the repeating units of another exemplary OLED display apparatus consistent with the disclosed embodiments.

FIG. 10 illustrates a top view of the repeating units of another exemplary OLED display apparatus consistent with the disclosed embodiments. Comparing with FIG. 3-9, the distribution of the photo spacers may be different; but other structures may be similar.

As shown in FIG. 10, the photo spacers 515 may be circular-shaped. The plurality of photo spacers 515 may surround the opening region 517. The photo spacers 515 may be aligned into two rows along the first direction X to form a first photo spacer group 511; and the projection of the photo spacer group 511 on the first direction X may be continuous. The photo spacers 515 may be aligned into two columns along the second direction Y to form a second photo spacer group 513 along a second direction Y; and the projection of the second photo spacer group 513 on the second direction Y may be continuous. The photo spacers 515 in two adjacent rows or two adjacent columns may have a staggered pattern; and the center-to-center connection lines of the centers of adjacent three photo spacers 515 may form a triangle 519. Each side of the triangle 519 may be greater than the diameter of the photo spacers 515. Further, adjacent photo spacers 515 may have certain distances; and may not connect to each other.

Figure 11:
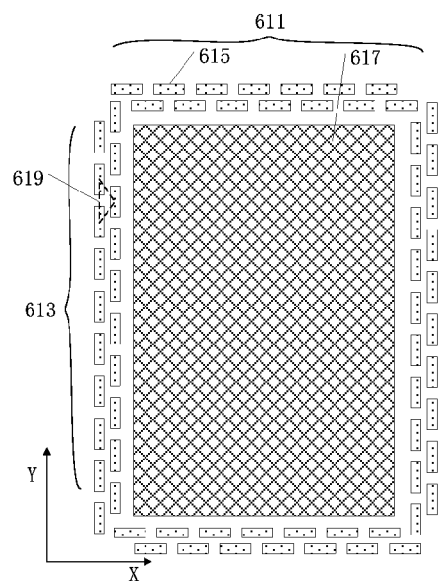
FIG. 11 illustrates the top view of the repeating units of another exemplary OLED display apparatus consistent with the disclosed embodiments.

In certain other embodiments, the photo spacers may be other close patterns. FIG. 11 illustrates a top view of the repeating units of another exemplary OLED display apparatus consistent with the disclosed embodiment.

As shown in FIG. 11, the photo spacers 615 are rectangular-shaped. The plurality of photo spacers 615 may surround the opening region 617. The photo spacers 615 may be aligned into two rows along the first direction X to form a first photo spacer group 611; and the projection of the first photo spacer group 611 on the first direction X may be continuous. The photo spacers 615 may be aligned into two columns along the second direction Y to form a second photo spacer group 613 along the second direction Y; and the projection of the second photo spacer group 613 on the second direction Y may be continuous. The photo spacers 615 in two adjacent rows or two adjacent columns may have a staggered pattern; and the connection lines of the crossing points of the diagonals of adjacent three photo spacers 615 may form a triangle 619. Adjacent photo spacers 615 may have certain distances; and may not connect to each other, or overlap with each other.

Comparing with the photo spacers with the line shape, the polyline shape, and the S shape, the fabrication of the circular photo spacers 515 and the rectangular photo spacers 615 may be relatively simple. The circular photo spacers 515 and the rectangular photo spacers 615 may have similar blocking performance as other shapes of photo spacers. Further, the staggered patterns of the circular photo spacers 515 and the rectangular photo spacers 615 may also ensure the electrical continuity of the second electrode.

In certain other embodiments, the photo spacers in the first photo spacer group and/or the second photo spacer groups may be aligned into three or more rows and/or columns, as long as the projection of the photo spacers in the first photo spacer group on the first direction X may be continuous; the projection of the photo spacers in the second photo spacer group on the second direction Y may be continuous; and the first photo spacer group and the second photo spacer group do not connect.

Figure 12:
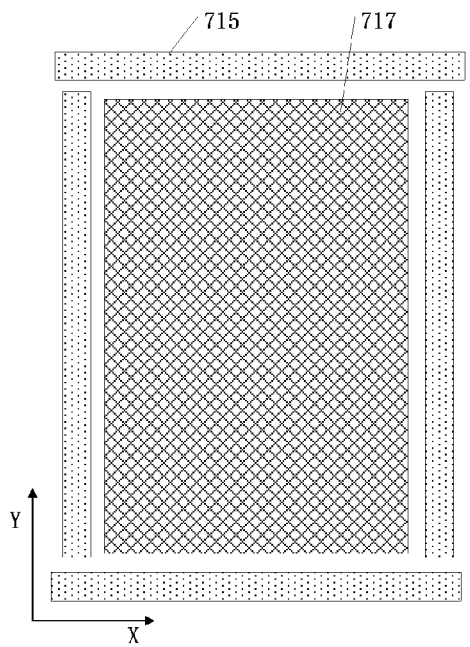
FIG. 12 illustrates the top view of the repeating units of another exemplary OLED display apparatus consistent with the disclosed embodiments.

FIG. 12 illustrates a top view of the repeating units of another exemplary OLED display apparatus consistent with the disclosed embodiments. Comparing with previously described OLED apparatus, the distribution of the photo spacers may be different; and other structures may be similar.

As shown in FIG. 12, the photo spacers 715 may be long stripes. The plurality of photo spacers 715 may surround the opening region 717. Further, each side of the opening region 717 may only have one photo spacer 715. The length of the photo spacer 715 along the first direction X may be greater than the length of the side of the opening region 717 along the first direction X; and the length of the photo spacer 715 along the second direction Y may be greater than the length of the side of the opening region 717 along the second direction Y. Further, the projection of the photo spacer 715 on the first direction X may not cross with the projection of the photo spacer 715 on the second direction Y.

Because each side of the opening region 717 may only have one photo spacer 715, if the projection of the photo spacer 715 on the first direction X cross with the projection of the photo spacer 715 on the second direction Y, the second electrode may be broken into pieces. Accordingly, the second electrode may be unable to properly drive the OLED display apparatus.

Further, according to the disclosed embodiments, a method for fabricating an OLED display apparatus is provided. The method for forming an OLED display apparatus may include forming an array substrate; forming a light-emitting module; and packaging. For illustrative purposes, the fabrication of the array substrate and the light-emitting module are described herein. The packaging process may follow any appropriate process.

Figure 13:
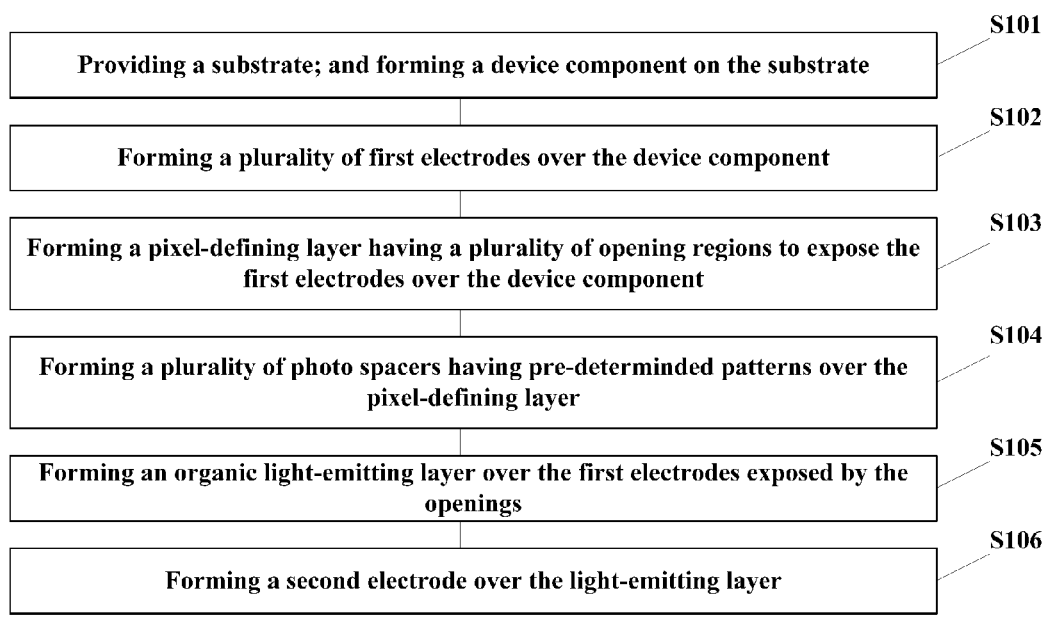
FIG. 13 illustrates an exemplary fabrication process of an OLED display apparatus consistent with the disclosed embodiments.

FIG. 13 illustrates an exemplary fabrication of an OLED display apparatus consistent with the disclosed embodiments. FIGS. 14a-14f illustrate semiconductor structures corresponding certain stages of the exemplary fabrication process.

Figure 14A:
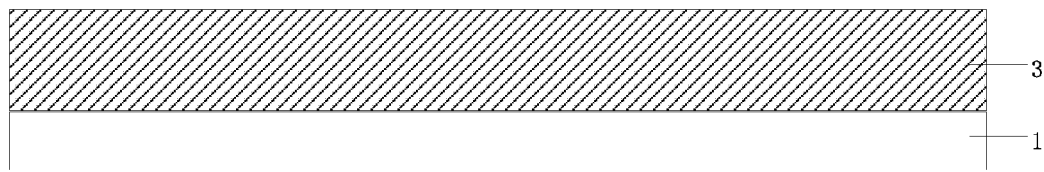
FIGS. 14a-14f illustrate structures corresponding certain stages of the exemplary fabrication process illustrated in FIG. 13.

As shown in FIG. 13, at the beginning of the fabrication process, a substrate is provided; and a device component may be formed on the substrate (S101). FIG. 14a illustrates a corresponding structure.

As shown in FIG. 14a, a substrate 1 is provided; and a device component layer 3 is formed on the substrate 1. Referring to FIG. 5, the process for forming the device component layer 3 may include forming a buffer layer 20 on the substrate 1; forming a semiconductor layer 12 on the buffer layer 20 by sequentially depositing a semiconductor material layer and etching the semiconductor material layer; forming a first insulation layer 22 on the semiconductor layer 12; forming a gate 14 on the semiconductor layer 12 by sequentially deposing a gate material layer and etching the gate material layer; forming a second insulation layer 24 on the gate 14; forming a source 18 and a drain 16 in the second insulation layer 24 and electrically connecting with the semiconductor layer 12 by sequentially forming throughholes exposing the semiconductor layer 12 in the second insulation layer 24, depositing a source/drain material layer in the through-holes and on the second insulation layer 24 and etching the source drain material layer; and forming a third insulation layer 26 on the second insulation layer 24.

Figure 14B:
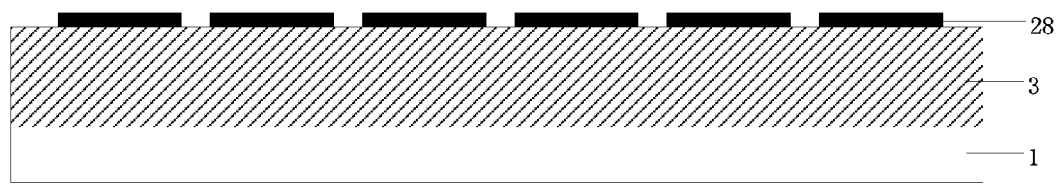

Returning to FIG. 13, after providing the substrate 1 and forming the device component layer 3, a plurality of first electrodes may be formed (S102). FIG. 14*b* illustrates a corresponding structure.

As shown in FIG. 14*b*, a plurality of first electrodes 28 are formed over the device component 3. Each of the plurality of first electrodes 28 may correspond to a sub-pixel region.

Specifically, the process for forming the plurality of first electrodes 28 may include forming a first electrode material layer on the device component layer 3; coating a photoresist layer on the first electrode material layer; exposing the photoresist layer using a mask having pre-disposed patterns and developing the exposed photoresist layer to form a patterned photoresist layer; and etching the first electrode material layer using the patterned photoresist layer as an etching mask. Thus, the plurality of first electrodes 28 may be formed.

The first electrodes 28 may be made of any appropriate material. In one embodiment, the first electrodes 28 are made of ITO.

The first electrode material layer may be etched by any appropriate process. In one embodiment, the first electrode material layer is etched by a wet etching process to form the plurality of first electrodes 28.

Figure 14C:
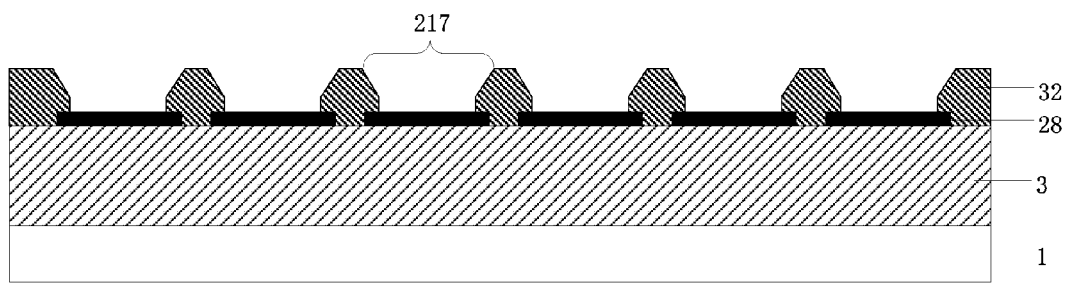

Returning to FIG. 13, after forming the first electrodes 28, a pixel-defining layer may be formed (S103). FIG. 14*c* illustrates a corresponding structure.

As shown in FIG. 14*c*, a pixel-defining layer (PDL) 32 is formed on the device component layer 3 and portions of the first electrodes 28. The pixel-defining layer 32 may have a plurality of opening regions 217 exposing the first electrodes 28. The regions of the exposed first electrodes 28 may correspond to the regions of subsequently formed subpixels. Thus, the opening regions 217 may also be referred as pixel regions 217.

The pixel-defining layer 32 may be formed by forming a first organic material layer on the first electrodes 28 and the device component layer 3; exposing the first organic material layer using a mask; and developing the exposed first organic material layer. Thus, the pixel-defining layer 32 may be formed.

Figure 14D:
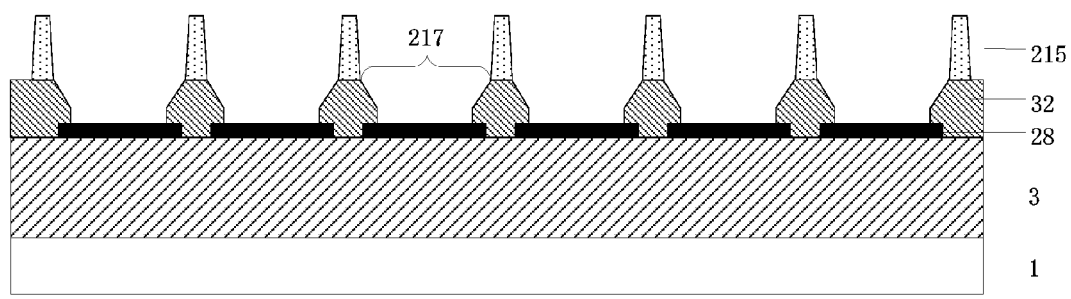

Returning to FIG. 13, after forming the pixel-defining layer 32, a plurality of photo spacers may be formed (S104). FIG. 14*d* illustrates a corresponding structure.

As shown in FIG. 14*d*, a plurality of photo spacers 215 distributed with pre-determined patterns are formed on the pixel-defining layer 32. The photo spacers 215 may surround the opening regions 217 (or the pixel regions 217). The photo spacers 215 may have any appropriate shapes, such as line-shape, polyline-shape, curve-shape, circular-shape, or rectangular-shape, etc., as exemplary shown in FIGS. 3 and 7-11. Referring to FIG. 3, the photo spacers 215 along the first direction X may be aligned into a first photo spacer group 211. The photo spacers 215 along the second direction Y may be aligned into a second photo spacer group 213. The projection of the first photo spacer group 211 on the first direction X may be continuous; and the projection of the second photo spacer group 213 on the second direction Y may be continuous. Further, the projection of the first photo spacer group 211 on the first direction X may cross with the projection of the second photo spacer group 213 on the second direction Y.

The process for forming the plurality of photo spacers 215 distributed with the pre-determined patterns may include forming a second organic material layer on the pixel-defining layer 32; exposing the second organic material layer using a mask; and developing the exposed second organic material layer. Thus, the plurality of photo spacers 215 may be formed on the pixel-defining layer 32.

Figure 14E:
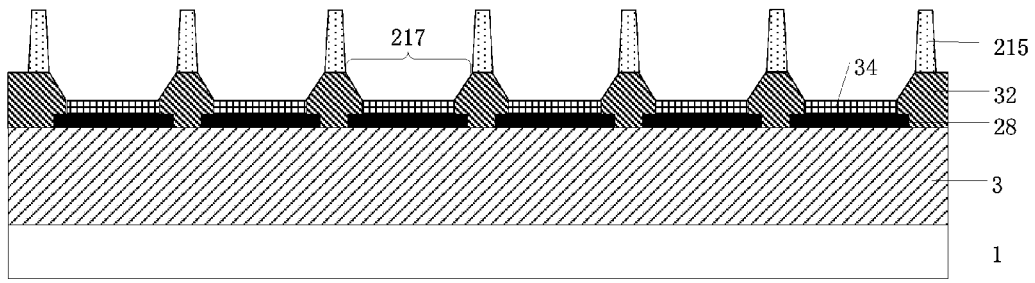

Returning to FIG. 13, after forming the photo spacers 215, a light-emitting layer may be formed (S105). FIG. 14*e* illustrates a corresponding structure.

As shown in FIG. 14*e*, a light-emitting layer 34 is formed on the first electrodes 28 exposed by the opening regions 217 of the pixel-defining layer 32. The light-emitting layer 34 may be formed by any appropriate process. In one embodiment, the light-emitting layer 34 is formed by an evaporation process.

Specifically, a mask may be disposed on the structure illustrated in FIG. 13*d* to cover the regions that should not have the light-emitting material; and a light-emitting material may be evaporated to form the light-emitting layer 34 illustrated in FIG. 14*e*. During the evaporation process, because the photo spacers 215 may have a blocking function to the organic light-emitting material, the mixing of two different materials may be prevented.

Figure 14F:
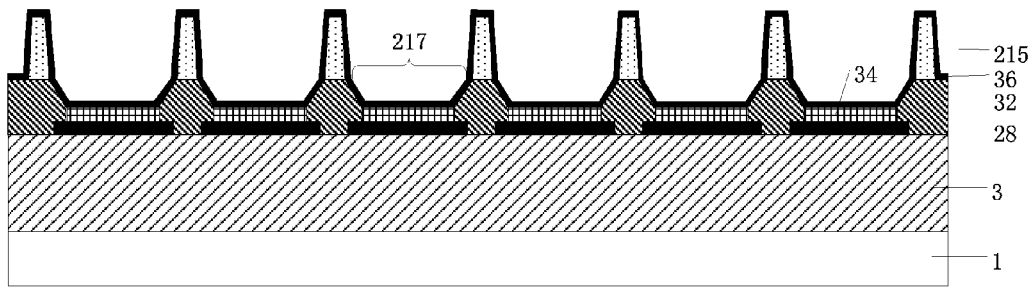

Returning to FIG. 13, after forming the organic light-emitting layer 34, a second electrode may be formed (S106). FIG. 14*f* illustrates a corresponding structure.

As shown in FIG. 14*f*, a second electrode 36 is formed on the organic light-emitting layer 34. The second electrode 36 may also cover the photo spacers 215. The second electrode 36 and the first electrodes 28 may together drive the organic light-emitting layer 34 to emit light.

The second electrode 36 may be formed by any appropriate process. In one embodiment, the second electrode 36 is formed by an evaporation process.

The second electrode 36 may be made of any appropriate material. In one embodiment, the second electrode 36 is made of Mg—Ag alloy.

During the evaporation process for forming the second electrode 36, because the external surface of the photo spacers 215 may be approximately perpendicular to the pixel-defining layer 32, it may be easy to break the second electrode 36 formed on the surfaces of the photo spacers 215. However, because the disclosed photo spacers 215 may have continuous projections; and may not connect to each other, there may be certain spaces among the adjacent photo spacers 215 to form the second electrode 36. Thus, the second electrode 36 may be electrically continuous.

After forming second electrode 36, the structure illustrated in FIG. 14*f* may be packaged by a cover plate. In one embodiment, the substrate 1 may be a rigid substrate, such as glass, or silica, etc.

In certain other embodiments, an organic flexible substrate 1 may be formed on a rigid glass substrate. For example, a layer of polyimide may be deposited on a glass substrate to form a flexible substrate 1. Then, the device arrays and the light-emitting module may be formed on the flexible substrate 1. Then, the structure may be packaged by a flexible device packaging process. Then, the flexible substrate 1 may be released from the glass substrate; and a flexible OLED display may be formed.

Further, according to the disclosed embodiments, another method for fabricating an OLED display apparatus is also provided. The method for forming an OLED display apparatus may include forming an array substrate; forming a light-emitting module; and packaging. For illustrative purposes, the fabrication of the array substrate and the light-emitting module are described herein. The packaging process may follow any appropriate process.

Figure 15:
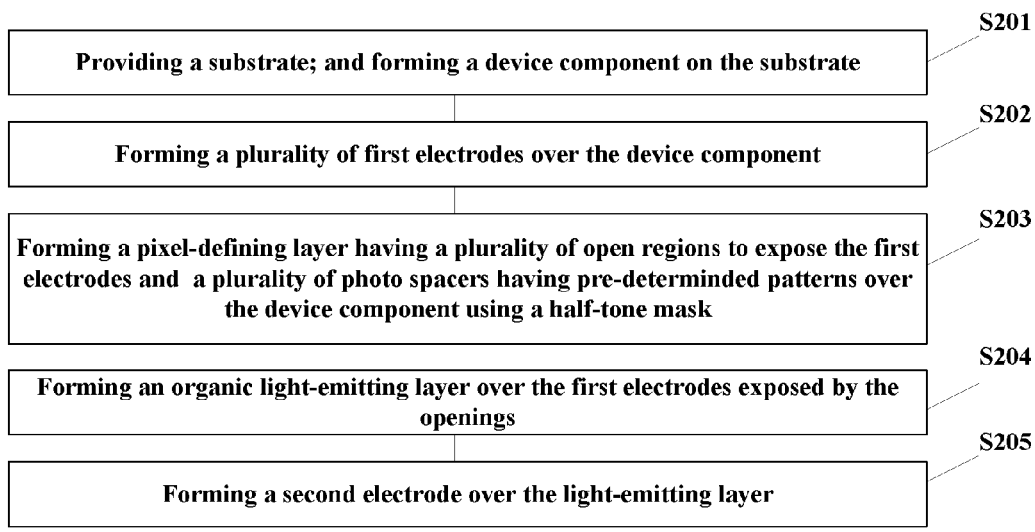
FIG. 15 illustrates another exemplary fabrication process an OLED display apparatus consistent with the disclosed embodiments.

FIG. 15 illustrates another exemplary fabrication of an OLED display consistent with the disclosed embodiments. FIGS. 16a-16e illustrate structures corresponding certain stages of the exemplary fabrication process.

Figure 16A:
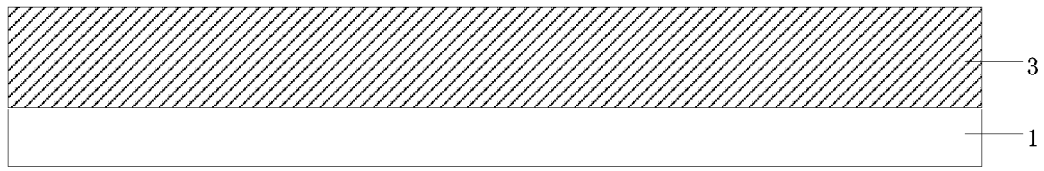
FIGS. 16a-16e illustrate structures corresponding certain stages of the exemplary fabrication process illustrated in FIG. 15.

As shown in FIG. 15, at the beginning of the fabrication process, a substrate is provided; and a device component layer may be formed on the substrate (S201). FIG. 16a illustrates a corresponding structure.

As shown in FIG. 16a, a substrate 1 is provided; and a device component layer 3 is formed on the substrate 1. Referring to FIG. 5, the process for forming the device component layer 3 may include forming a buffer layer 20 on the substrate 1; forming a semiconductor layer 12 on the buffer layer 20 by sequentially depositing a semiconductor material layer and etching the semiconductor material layer; forming a first insulation layer 22 on the semiconductor layer 12; forming a gate 14 on the semiconductor layer by sequentially deposing a gate material layer and etching the gate material layer; forming a second insulation layer 24 on the gate 14; forming a source 18 and a drain 16 in the second insulation layer 24 and electrically connecting with the semiconductor layer 12 by sequentially forming through-holes exposing the semiconductor layer 12 in the second insulation layer 24, depositing a source/drain material layer in the through-holes and on the second insulation layer 24 and etching the source drain material layer; and forming a third insulation layer 26 on the second insulation layer 24.

Figure 16B:
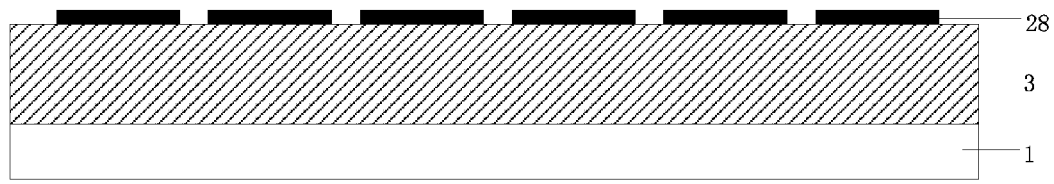

Returning to FIG. 15, after providing the substrate 1, and forming the device component layer 3, a plurality of first electrodes may be formed (S202). FIG. 16b illustrates a semiconductor structure.

As shown in FIG. 16b, a plurality of first electrodes 28 are formed over the device component layer 3. Each of the plurality of first electrodes 28 may correspond to a sub-pixel region.

Specifically, the process for forming the plurality of first electrodes 28 may include forming a first electrode material layer on the device component layer 3; coating a photoresist layer on the first electrode material layer; exposing the photoresist layer using a mask having pre-disposed patterns, and developing the exposed photoresist layer to form a patterned photoresist layer; and etching the first electrode material layer using the patterned photoresist layer as an etching mask. Thus, the plurality of first electrodes 28 may be formed.

The first electrodes 28 may be made of any appropriate material. In one embodiment, the first electrodes 28 are made of transparent ITO.

The first electrode material layer may be etched by any appropriate process. In one embodiment, the first electrode material layer is etched by a wet etching process to form the plurality of first electrodes 28.

Figure 16C:
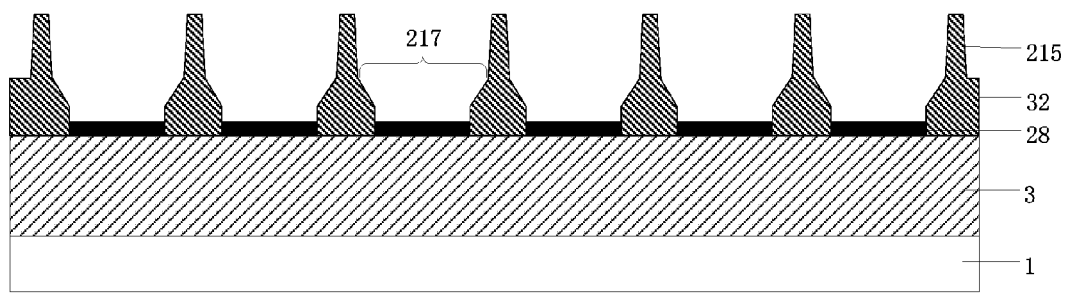

Returning to FIG. 15, after forming the plurality of first electrodes 28, a pixel-defining layer and a plurality of photo spacers may be formed (S203). FIG. 16c illustrates a corresponding structure.

As shown in FIG. 16c, a pixel-defining layer 32 is formed on surface portions of the device component layer 3 exposed by the first electrodes 28. The pixel-defining layer 32 may have a plurality of opening regions 217 exposing the plurality of first electrodes 28. Further, a plurality of photo spacers 215 distributed with pre-determined patterns are formed on the pixel-defining layer 32. The photo spacers 215 may surround the opening regions 217 (or the pixel regions 217). Referring to FIG. 3, the photo spacers 215 along the first direction X may be aligned into a first photo spacer group 211. The photo spacers 215 along the second direction Y may be aligned into a second photo spacer group 213. The projection of the first photo spacer group 211 on the first direction X may be continuous; and the projection of the second photo spacer group 215 on the second direction Y may be continuous. Further, the projection of the first photo spacer group 211 on the first direction X may cross with the projection of the second photo spacer group 213 on the second direction Y.

The process for forming the pixel-defining layer 32 and the plurality of photo spacers 215 distributed with the pre-determined patterns may include forming an organic material layer on the first electrodes 28 and the portions of the device component layer 3 exposed by the first electrodes 28; and performing a half-tone exposure process to expose the organic material layer using a half-tone mask; and developing the exposed organic material layer. Thus, the pixel-defining layer 32 and the plurality of photo spacers 215 may be formed simultaneously. That is, the pixel-defining layer 32 and the plurality of photo spacers 215 may be formed by a single, same exposure process.

In certain other embodiments, a gray-tone mask may be used to expose the organic material layer instead of the half-tone mask. To obtain the structures of the pixel-defining layer 32 and the photo spacers 215 illustrated in FIG. 15c, the transparency of the gray region of the half-tone mask, or the gray-tone mask under an UV light (i-line, 365 nm) may be in a range of approximately 10%-80%.

Figure 16D:
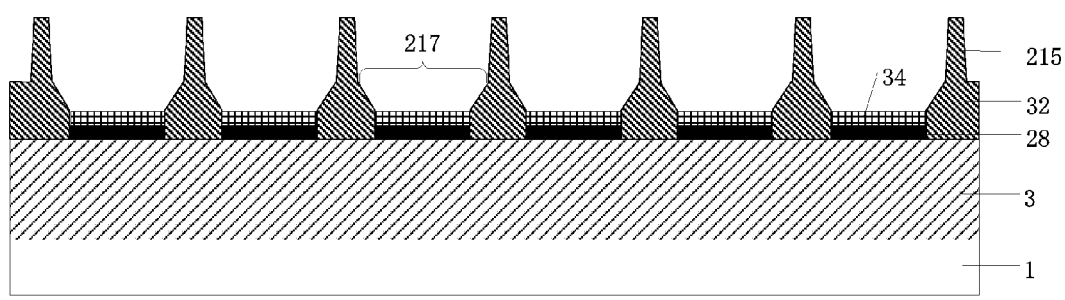

Returning to FIG. 15, after forming the pixel-defining layer 32 and the photo spacers 215, a light-emitting layer may be formed (S204). FIG. 16d illustrates a corresponding structure.

As shown in FIG. 16d, a light-emitting layer 34 is formed on the first electrodes 28 exposed by the opening regions 217 of the pixel-defining layer 32. The light-emitting layer 34 may be formed by any appropriate process. In one embodiment, the light-emitting layer is formed by an evaporation process.

Specifically, a mask may be disposed on the structure illustrated in FIG. 16c to cover the regions that should not have the light-emitting material; and a light-emitting material may be evaporated to form the light-emitting layer 34 illustrated in FIG. 15d. During the evaporation process, because the photo spacers 215 may have a blocking function to the organic light-emitting material, the mixing of two different light-emitting materials may be prevented.

Figure 16E:
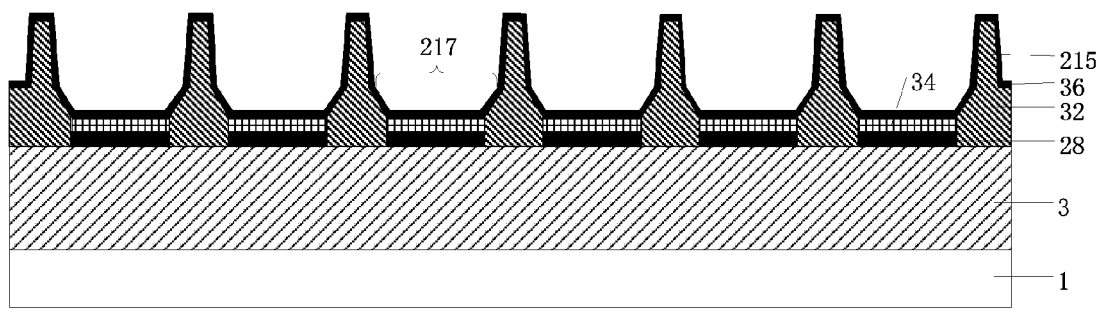

Returning to FIG. 15, after forming the organic light-emitting layer 34, a second electrode may be formed (S205). FIG. 16e illustrates a corresponding structure.

As shown in FIG. 16e, a second electrode 36 is formed on the organic light-emitting layer 34. The second electrode 36 may also cover the photo spacers 215. The second electrode 36 and the first electrodes 28 may together drive the organic light-emitting layer 34 to emit light.

The second electrode 36 may be made of any appropriate material. In one embodiment, the second electrode 36 is made of Mg—Ag alloy.

After forming the second electrode 36, the structure illustrated in FIG. 16e may be packaged by a cover plate. In certain other embodiments, an organic flexible substrate 1 may formed on a rigid glass substrate. For example, a layer of polyimide may be deposited on a glass substrate to form a flexible substrate 1. Then, the device arrays and the light-emitting module may be formed on the flexible substrate 1. Then, the structure may be packaged by a flexible device packaging process. Then, the flexible substrate 1 may be released from the glass substrate. Thus, a flexible OLED display apparatus may be formed.

Thus, according to the disclosed structures and processes, the high-density photo spacers aligned with the predetermined patterns may block the organic light-emitting material during the evaporation of the organic light-emitting material for forming the light-emitting layer. Thus, the overlap regions between adjacent pixel regions may be prevented. Accordingly, the color mixing issue of the OLED display apparatus may be avoided.

Further, the projections of photo spacers may be continuous; and the photo spacers do not connect and/or overlap. Thus, they may not cause the second electrode to be broken; or may not increase the resistance of the second electrode.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. An organic light-emitting display apparatus, comprising:
   a substrate;
   a device component layer disposed over the substrate;
   a plurality of first electrodes disposed over the device component layer and one-to-one corresponding to a plurality of sub-pixels;
   a pixel-defining layer having a plurality of opening regions to expose the first electrodes formed over the device component layer;
   a plurality of photo spacers, disposed on the pixel-defining layer and between adjacent opening regions, and surrounding at least one opening region to provide a first photo spacer group along the at least one opening region in a first direction and provide a second photo spacer group along the at least one opening region in a second direction different from the first direction;
   an organic light-emitting layer disposed in the at least one opening region of the pixel-defining layer and in contact with the first electrodes; and
   a second electrode disposed on the organic light-emitting layer,
   wherein the first photo spacer group comprises a plurality of isolated first photo spacers, and the second photo spacer group comprises a plurality of isolated second photo spacers, and
   the first photo spacer group has a continuous projection on the first direction, and the second photo spacer group has a continuous projection on the second direction.

2. The organic light-emitting display apparatus according to claim 1, wherein, when the organic light-emitting layers in adjacent opening regions emit different colors of light:
   the photo spacers surround each of the adjacent opening regions.

3. The organic light-emitting display apparatus according to claim 1, wherein, when the organic light-emitting layers in two adjacent opening regions emit a same color of light:
   the photo spacers are configured to surround the two adjacent opening regions without being disposed between the two adjacent opening regions.

4. The organic light-emitting display apparatus according to claim 1, wherein, when the organic light-emitting layers in a plurality of adjacent opening regions in the first or second direction emit a same color of light:
   the photo spacers surround the plurality of adjacent opening regions without being disposed between any two adjacent opening regions of the plurality of adjacent opening regions.

5. The organic light-emitting display apparatus according to claim 1, wherein:
   a photo spacer has a circular-shape.

6. The organic light-emitting display apparatus according to claim 2, wherein:
   a length of the continuous projection of the first photo spacer group on the first direction is greater than a length of the opening region along the first direction;
   a length of the continuous projection of the second photo spacer group on the second direction is greater than a length of the opening region along the second direction.

7. The organic light-emitting display apparatus according to claim 5, wherein:
   the continuous projection of the first spacer group on the first direction does not cross with the continuous projection of the second spacer group on the second direction.

8. The organic light-emitting display apparatus according to claim 5, wherein, for the photo spacers having one of line-shape, a circular-shape, and a rectangular-shape,
   the continuous projection of the first spacer group on the first direction crosses with the continuous projection of the second spacer group on the second direction.

9. The organic light-emitting display apparatus according to claim 5, wherein, for the photo spacers having the circular-shape,
   connection lines of centers of adjacent three photo spacers in the first photo spacer group or the second spacer group form a triangle.

10. The organic light-emitting display apparatus according to claim 1, wherein:
    the second electrode is directly disposed on the plurality of photo spacer; and
    the second electrode is directly disposed in a region between adjacent photo spacers.

11. The organic light-emitting display apparatus according to claim 1, wherein:
    any photo spacers surrounding the at least one opening region are not connected to any photo spacers surrounding any opening regions adjacent to the at least one opening region.

12. The organic light-emitting display apparatus according to claim 1, wherein:
    any first photo spacers are not connected to any second photo spacers.

* * * * *